United States Patent [19]

Yamaguchi et al.

[11] Patent Number: 5,040,037
[45] Date of Patent: Aug. 13, 1991

[54] MOS TYPE FIELD EFFECT TRANSISTOR FORMED ON A SEMICONDUCTOR LAYER ON AN INSULATOR SUBSTRATE

[75] Inventors: Yasuo Yamaguchi; Shigeru Kusunoki, both of Itami, Japan

[73] Assignee: Mitsubishi Denki Kabushiki Kaisha, Tokyo, Japan

[21] Appl. No.: 448,119

[22] Filed: Dec. 11, 1989

[30] Foreign Application Priority Data

Dec. 13, 1988 [JP] Japan ................. 63-315807

[51] Int. Cl.$^5$ ................. H01L 27/01
[52] U.S. Cl. ................. 357/23.7; 357/23.4; 357/67; 357/23.1
[58] Field of Search ........... 357/23.7, 23.4, 67 S

[56] References Cited

U.S. PATENT DOCUMENTS

| 4,053,916 | 10/1977 | Cricchi et al. | 357/23.7 |
| 4,489,339 | 12/1984 | Uchida | 357/23.7 |
| 4,506,279 | 3/1985 | Mizutani | 357/23.4 |
| 4,597,824 | 7/1986 | Shinada et al. | 357/23.4 |
| 4,763,183 | 8/1988 | Ng et al. | 357/23.7 |
| 4,797,721 | 1/1989 | Hsu | 357/23.7 |
| 4,943,837 | 7/1990 | Konishi et al. | 357/23.7 |

FOREIGN PATENT DOCUMENTS

| 147186 | 6/1975 | Japan | 357/23.7 |
| 0071638 | 5/1980 | Japan | 357/23.7 |
| 60-088474 | 5/1985 | Japan | 357/67 S |
| 62-117372 | 5/1987 | Japan | 357/23.4 |
| 127272 | 1/1989 | Japan | 357/23.1 |
| 8808202 | 10/1988 | World Int. Prop. O. | 357/23.7 |

OTHER PUBLICATIONS

J. Colinge, "Reduction of Kink Effect in Thin-Film SOI MOSFET's", IEEE Electron Device Letters, vol. 9, No. 2, Feb. 1988, pp. 97-99.

Primary Examiner—Jerome Jackson, Jr.
Assistant Examiner—Dang Xuan Hung
Attorney, Agent, or Firm—Lowe, Price, LeBlanc and Becker

[57] ABSTRACT

A SOI-MOSFET formed on a thin semiconductor layer (3) having a thickness not more than 1500Å includes a charge carrier absorbing region (9a, 9b, 9c) contacting with at least a portion of the bottom of a channel region (6) of a first conductivity type and with at least a portion of the bottom of a source region (7, 7a) of a second conductivity type. The carrier absorbing region (9a, 9b, 9c) absorbs excess carriers of the first conductivity type contained in the channel region (6).

22 Claims, 8 Drawing Sheets

MOS TYPE FIELD EFFECT TRANSISTOR FORMED ON A SEMICONDUCTOR LAYER ON AN INSULATOR SUBSTRATE

BACKGROUND OF THE INVENTION

1. Field of the Invention

This invention relates to a MOS (Metal Oxide Semiconductor) type field effect transistor formed on a semiconductor layer on an insulator substrate, referred to hereinafter as SOI-MOSFET, and more particularly, to an improvement in the source to drain voltage withstand characteristics of SOI-MOSFET devices.

2. Description of the Related Art

Referring to FIG. 8, there is shown a conventional SOI-MOSFET is a cross section. An insulator layer 2 is formed on a silicon substrate 1 and a silicon layer 3 is formed on the insulator layer. A channel region 6 containing p-type impurities at a low concentration of, for example, $10^{16}$–$10^{17}$ atoms/cm$^3$, is formed within the silicon layer 3, while a source region 7 and a drain region 8, both having high n-type impurity concentration of, for example, $10^{19}$–$10^{21}$ atoms/cm$^3$, are formed in contact with one side and the other side of the channel region 6, respectively.

On the channel region 6, a dielectric thin film 4 acting as a gate is formed, and a gate electrode 5 is formed on the dielectric thin film 4. The silicon layer 3 and the gate electrode 5 are covered by an interlayer insulating film 11. Contact holes 12a, 12b are formed in the interlayer insulating film 11, and electrical conductors 13a, 13b are formed in register with these contact holes.

In the above described SOI-MOSFET, when a positive voltage is applied to the gate electrode 5, n-conductivity type carriers or electrons are attracted towards an upper portion of the p-type channel region 6. The conductivity type of this upper portion is inverted to n-type which is the same as the conductivity type of the source region 7 and the drain region 8. Thus the current is allowed to flow between the source region 7 and the drain region 8. Inasmuch as the n-type carriers attracted towards the upper portion of the channel region 6 are changed in concentration with the gate voltage, the amount of the current flowing through the channel region 6 may be controlled by the gate voltage. The above is the operating principle of both the conventional MOSFET and SOI-MOSFET.

As schematically illustrated in FIG. 9, when the drain voltage is increased in a SOI-MOSFET formed on a silicon layer 3 having a larger thickness of about 5000 Å, a depletion layer (shown by a broken line) in the vicinity of the drain 8 is extended toward the source 7 particularly in a deeper region where it is difficult to control the potential by the gate electrode. When the depletion layer reaches and is combined with another depletion layer (also shown by another broken line) formed in the vicinity of the source 7, there occurs a phenomenon known as the punch-through phenomenon, in which the electrical barrier between the source 7 and the channel is lowered and the potential at the deeper region that cannot be controlled by the gate electrode is increased so that the channel current is increased suddenly. The punch-through of carriers is shown by an arrow in FIG. 9 and this may lower the source to drain withstand voltage characteristics.

Also, when a high voltage is applied across the source and the drain, the carriers are accelerated to a higher velocity within the channel region 6. With these carriers accelerated within the channel region 6, electron and positive hole pairs are produced in the vicinity of the drain region 8 due to ionization by collision which can occur at voltages which may be less than voltages at which the punch-through effect occurs. The electrons thus produced flow into a n+ type drain region 8. As schematically illustrated in FIG. 10, in case of a conventional MOSFET formed on a bulky silicon substrate 3a, the produced positive holes can be removed through a substrate electrode to the ground. In a SOI-MOSFET, however, since the positive holes are stored in the channel region 6 formed on the insulator 2 and thus raise the potential of the channel region in normal operation, when excess holes are generated by ionization, the potential of the channel region and the channel current are further increased to produce undesirable kink effect on a curve representing the relation between the drain voltage and the drain current. FIG. 11 shows examples of such kinks on curves representing the relation between the drain voltage $V_D$ and the drain current $I_D$, where arrows directing downward indicate the kink effect and arrows directing upward indicate the punch-through phenomenon. This kink effect is discussed for in, for example, IEEE Electron Device Letter. Vol. 9, No. 2, pp. 97-99, 1988.

On the other hand, as also discussed in this article, the thin film SOI-MOSFET having an extremely thin silicon layer 3 with, for example, 500–1500 Å has superior properties as compared with the usual SOI-MOSFET having a thicker silicon layer 3. For example, its thin channel region 6 is turned as a whole into a depletion layer, upon application of a voltage to the gate electrode 5, while the potential is controlled by the gate electrode, so that the aforementioned punch-through phenomenon in the deeper layer of the channel region and the kink effect are eliminated. Also the short channel effect, in which the gate threshold voltage is unusually lowered in case of a shorter gate length, is also reduced, since the depletion layer controlled by the gate will extend for the entire depth of the thin channel region.

However, when the channel region 6 as a whole is turned into a depletion layer, the potential within the channel region 6 becomes higher than in the case of the conventional MOSFET. Thus the electrical barrier between the source region 7 and the channel region 6 and, hence, the threshold of the transistor is lowered. Moreover, when the positive holes produced by the aforementioned ionization upon collision are stored temporarily in the channel region 6, the potential within the channel region 6 is increased further so that electrons are introduced abruptly from the source region 7 into the channel region 6. That is, the breakdown voltage characteristics between the source and the drain is inconveniently lowered even in the thin film SOI-MOSFET.

SUMMARY OF THE INVENTION

In view of the above described disadvantages of the prior art, it is an object of the present invention to provide a SOI-MOSFET in which the source to drain voltage withstand characteristics are improved.

Another object of the present invention is to provide a SOI-MOSFET in which the entire channel region can surely be controlled by the gate electrode.

According to an aspect of the present invention, a SOI-MOSFET comprises, source and drain regions formed of respective impurity regions of a first type in a thin semiconductor layer deposited not more than 1500 Å in thickness on an insulator, a channel region having a predetermined impurity concentration of a second type in the thin semiconductor layer between the source region and the drain region, a gate electrode positioned adjacent the channel region and separated from the semiconductor layer by an insulator layer deposited on the semiconductor layer, and at least one carrier storage region having an impurity concentration of the second type higher than the impurity concentration of the channel region whereby excess carriers of the second type are removed from the channel region into the carrier storage region.

According to another aspect of the present invention, a SOI-MOSFET comprises, instead of the carrier storage region, a crystal defect region having crystal defects whereby excess carriers of the second type are removed from the channel region into the crystal defect region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
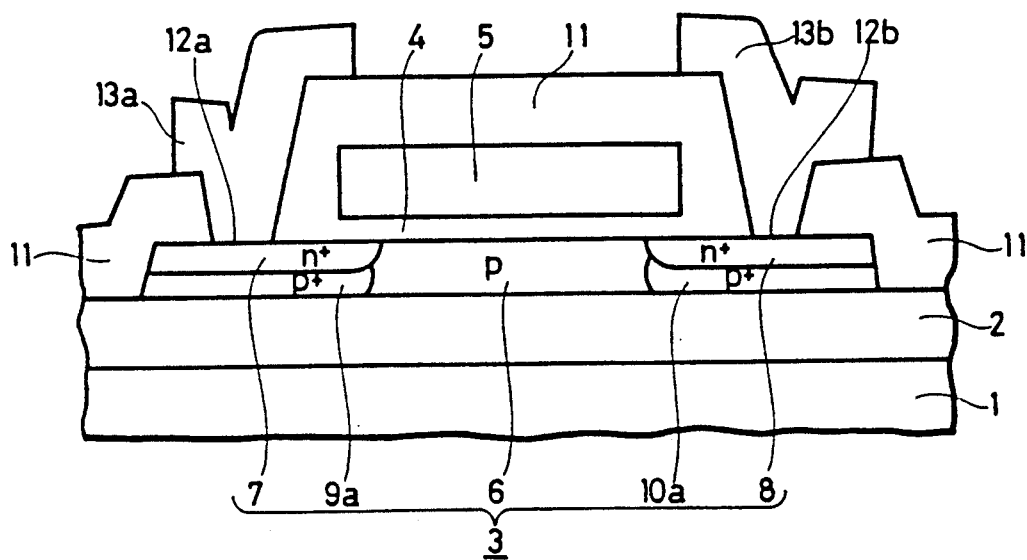
FIG. 1 is a sectional view showing a thin film SOI-MOSFET according to an embodiment of the present invention.

Referring to FIG. 1, a thin film SOI-MOSFET according to an embodiment of the present invention is shown in cross section. An insulating layer 2 is formed on a silicon substrate 1, and an island of a silicon thin film 3 having a thickness of about 500–1500 Å is formed on the insulating layer 2. A channel region 6 having a low concentration of P-type impurities of, for example, $10^{16}$ to $10^{17}$ atoms/cm$^3$, is formed within the silicon layer 3. A source region 7 and a drain region 8 each having a high concentration of N-type impurities of, for example, $10^{19}$ to $10^{21}$ atoms/cm$^3$, are formed in the upper layer of the silicon layer 3 in contact with one side and the other side of the channel region 6, respectively. Below the source region 7 and the drain region 8, carrier storage regions 9a and 10a each containing impurities, such as boron, at a high concentration of, for example, $10^{17}$ to $10^{19}$ atoms/cm$^3$, are formed so as to be in contact with the channel layer 6.

A dielectric thin film 4 acting as a gate is formed on the channel region 6, and a gate electrode 5 is formed on the dielectric thin film 4. The silicon layer 3 and the gate electrode 5 are covered by an interlayer insulating film 11. Contact holes 12a, 12b are formed in the interlayer insulating film 11 and electric conductors 13a, 13b are formed in register with the contact holes.

In order that a depletion layer controlled by the gate electrode may extend for the entire depth of the channel region 6 having an impurity concentration of $10^{16}$ to $10^{17}$ atoms/cm$^3$, the thickness of the silicon film 3 must be thinner than 1500 Å.

It is noted that the source region 7 and the drain region 8 forming the upper region of the silicon layer 3 may be formed in a self-aligning fashion by injecting n-type impurities by ion implantation to a shallow depth at lower energies using the gate electrode 5 as the mask. Similarly, the carrier storage regions 9a and 10a forming the lower region of the silicon layer 3 may be formed easily by injecting p-type impurities by ion implantation to a deeper depth at higher energies.

In the thin film SOI-MOSFET of FIG. 1, even when the excess positive holes are produced in the channel region 6 by ionization upon collision, excess positive holes will flow from the thin channel region 6, which is turned in its entirety into a depletion layer by the gate voltage and thereby increased in electrical potential, into the carrier storage regions 9a, 10a, having lower electrical potentials. Thus the excess positive holes produced by ionization upon collision are not stored in the channel region 6 so that the amount of the electrons to be injected from the source region 7 into the channel region 6 is not increased abruptly. The result is the improved source to drain withstand voltage properties of the thin film SOI-MOSFET.

On the other hand, in a usual SOI-MOSFET formed on a silicon layer having a larger thickness of about 5000 Å, the punch-through phenomenon and the kink effect may still occur. In the Japanese Patent Lying Open Nos. 193170/1987 and Nos. 193171/1987, there is disclosed a structure of the usual SOI-MOSFET having a silicon layer about 5000 Å thick which is similar to the SOI-MOSFET shown in FIG. 1. However, the Japanese Patent Laying Open Nos. 193170/1987 and Nos. 193171/1987 are aimed to prevent the back channel from being produced in the boundary region between the insulator substrate and the silicon layer. Flow of carriers in the back channel can not be controlled by the gate voltage, because the back channel is far from the gate electrode in the usual SOI-MOSFET. In the thin film SOI-MOSFET, however, the back channel can also controlled by the gate voltage, because the distance between the back channel and the gage electrode is small.

Figure 2:
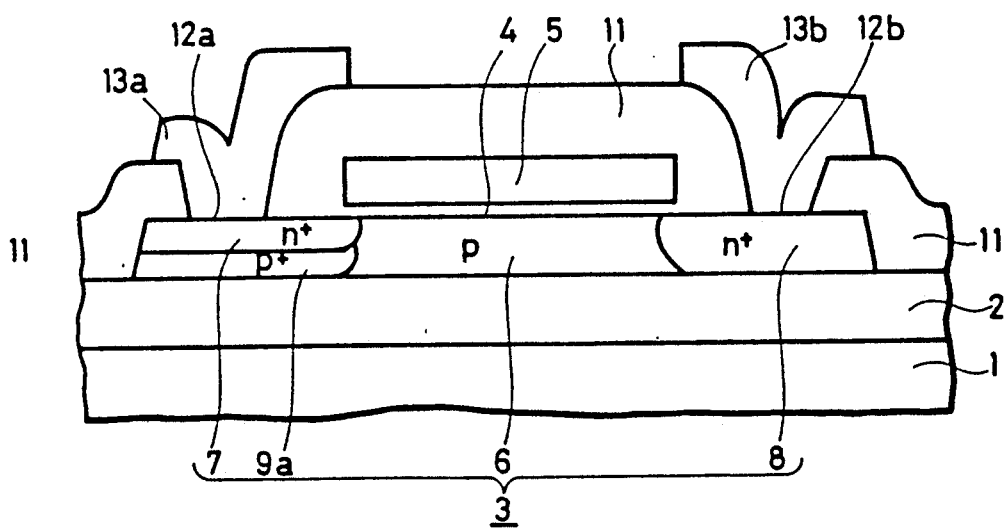
FIG. 2 is a sectional view showing another embodiment of the present invention.

Referring to FIG. 2, a thin film SOI-MOSFET according to another embodiment of the present invention is shown in cross section. Although the thin film SOI-MOSFET of FIG. 2 is similar to that shown in FIG. 1, the carrier storage region 9a is formed only below the source region 7, in the embodiment of FIG. 2, while the drain region extend to the bottom of the silicon layer 3.

Into the upper portions of the source region 7 and the drain region 8, n-type impurities are injected by ion implantation at lower energies to a higher concentration of, for example, $10^{19}$ to $10^{21}$ atoms/cm$^3$, using the gate electrode 5 as a mask. Then, for forming the lower layer portion of the drain region 8, n-type impurities are injected by ion implantation at higher energies to a lower concentration of, for example, $10^{17}$ atoms/cm$^3$. Then, after the drain region 8 is covered by a resist mask, p-type impurities are injected into a layer below the source region 7 by ion implantation at higher energies to a higher concentration of, for example, $10^{17}$ to $10^{19}$ atoms/cm$^3$. In this manner, the silicon layer 3 having the structure shown in FIG. 2 is formed.

In the thin SOI-MOSFET of FIG. 2, the drain region containing n-type impurities at a higher concentration is not contacted directly with the carrier storage regions containing p-type impurities at a higher concentration, so that there is no risk that the source to drain withstand voltage characteristics be lowered due to deterioration in the pn junction withstand voltage of the drain 8.

FIGS. 3A to 3E are cross sectional views for illustrating the structure and the manufacturing method for the SOI-MOSFET according to a further embodiment of the present invention.

Figure 3A:
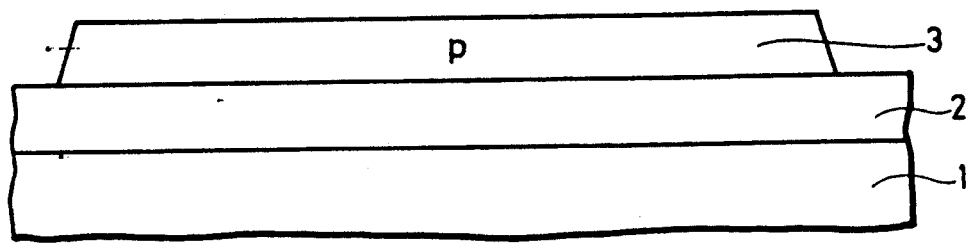
FIGS. 3A to 3E are sectional views for illustrating the structure and the manufacture method for the thin film SOI-MOSFET according to a modification of the present invention.

Referring to FIG. 3A, an insulating layer 3 is formed on a silicon substrate 1, and an island of a silicon thin film 3 containing p-type impurities at a lower concentration of, for example, $10^{16}$ to $10^{17}$ atoms/cm$^3$ is formed on the insulating layer 2. This island 3 of the silicon thin film is electrically separated from other islands, not shown.

Figure 3B:
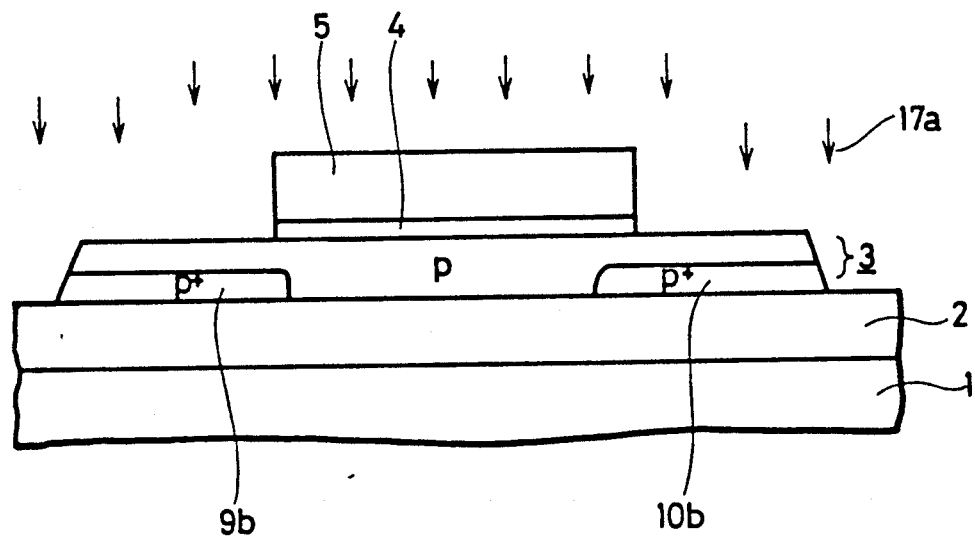

Referring to FIG. 3B, a thin dielectric film 4 acting as a gate is formed on the silicon layer 3, and a gate electrode 5 is formed on the dielectric thin film 4. Then, carrier storage regions 9b, 10b containing impurities at higher concentration of, for example, $10^{17}$ to $10^{19}$ atoms/cm$^3$, are formed by injecting p-type impurities 17a, such as boron, into the lower layer portion of the silicon layer 3 by ion implantation using the gate electrode 5 as a mask.

Figure 3C:
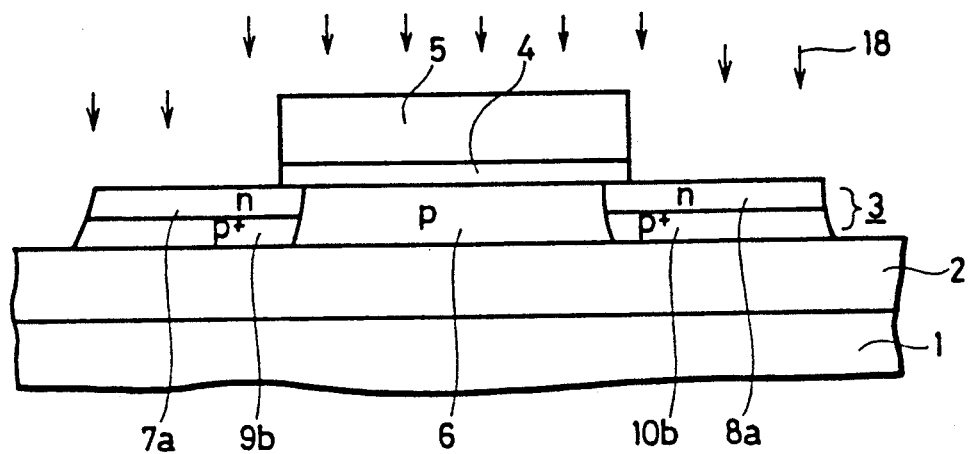

Referring to FIG. 3C, an additional source region 7a and an additional drain 8a, each containing impurities at a medium concentration of for example, $10^{17}$ to $10^{18}$ atoms/cm$^3$, are formed by injecting n-type impurities 18, such as phosphorus, into the upper layer portion of the silicon layer 3, similarly using the gate electrode 5 as a mask.

Figure 3D:
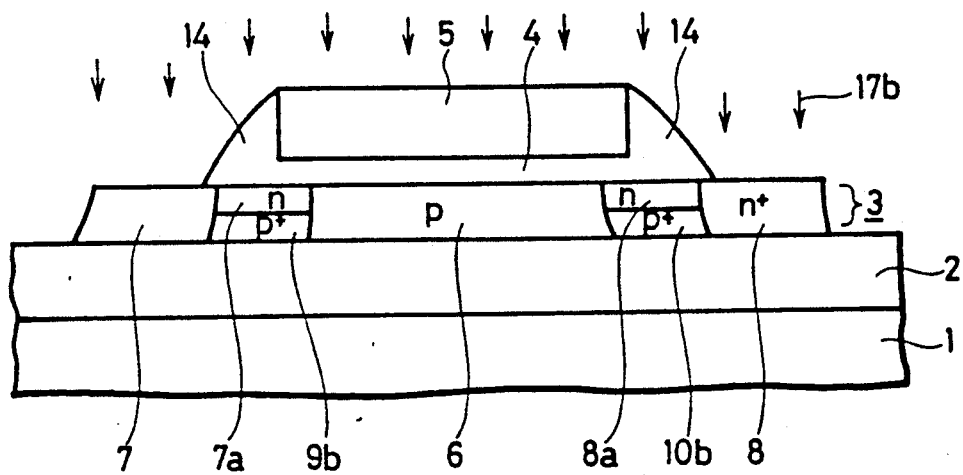

Referring to FIG. 3D a silicon oxide film is deposited to a predetermined thickness (not shown) by chemical vapor deposition (CVD), so as to cover the silicon layer 3 and the gate electrode 5. The deposited oxide film is subjected to a reactive ion etching to form an insulator side wall 14 on the sidewall of the gate electrode 5. Then, a source region 7 and a drain region 8 containing impurities at a higher concentration of, for example, $10^{19}$ to $10^{21}$ atoms/cm$^3$, are formed by injecting n-type impurities 17b, such as arsenic, for the entire thickness of the silicon layer 3, using the gate electrode 5 and the insulator wall 14 as a mask.

Figure 3E:
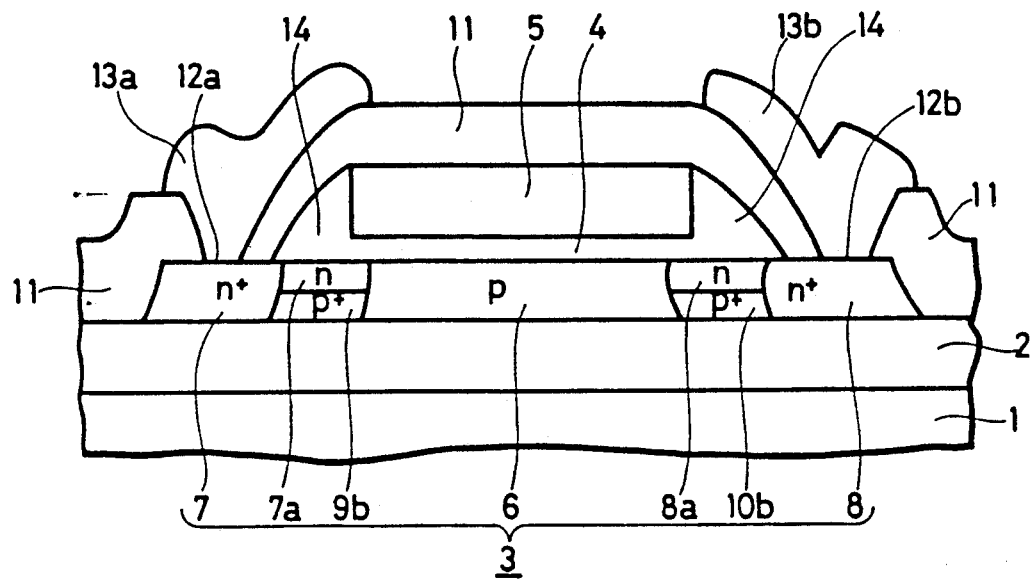

Referring to FIG. 3E, an interlayer insulating film 11 is formed for covering the silicon layer 3 and the gate electrode 5. Contact holes 12a, 12b are formed in the insulating layer 11, and electrical conductors 13a, 13b are formed in register with these contact holes to complete the thin film SOI-MOSFET.

The thin film SOI-MOSFET of FIG. 3E is provided not only with the carrier storage regions 9b, 10b, but with an additional lightly doped drain (LDD) 8a. The LDD 8a operates to weaken or relax the electrical field in the vicinity of the drain, so that it acts to decrease the ionization upon collision which might otherwise produce excess positive holes within the channel region 6. The LDD 8a also acts for preventing the drain junction withstand voltage caused by the presence of the carrier storage region 10b containing the p-type impurities at a higher concentration from being decreased. Thus the carrier storage regions 9, 10b are built into the thin film SOI-MOSFET along with the additional LD source region 7a and the additional LD drain region 8a for further improving the source to drain withstand voltage characteristics.

It will be appreciated to those skilled in the art that the carrier storage regions 9b and 10b may also extend into the lower portion of the source region 7 and into the lower portion of the drain region 8, respectively.

Figure 4:
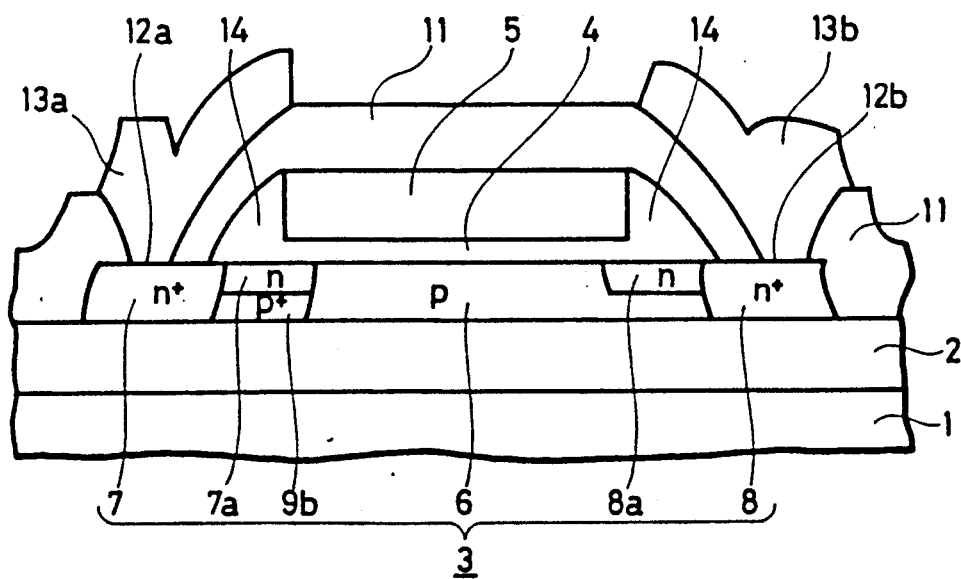
FIGS. 4 to 7 are sectional view showing a further modification.

Referring to FIG. 4, a thin film SOI-MOSFET according to a further embodiment of the present invention is shown in cross section. Although the thin film SOI-MOSFET of FIG. 4 is similar to that shown in FIG. 3E, the carrier storage region 9b is provided in FIG. 4 only below the additional source region 7a while no carrier storage region is provided below the additional LD drain region 8a. Hence, in the thin film SOI-MOSFET of FIG. 4, there is no risk of deterioration of the drain junction withstand voltage.

Figure 5:
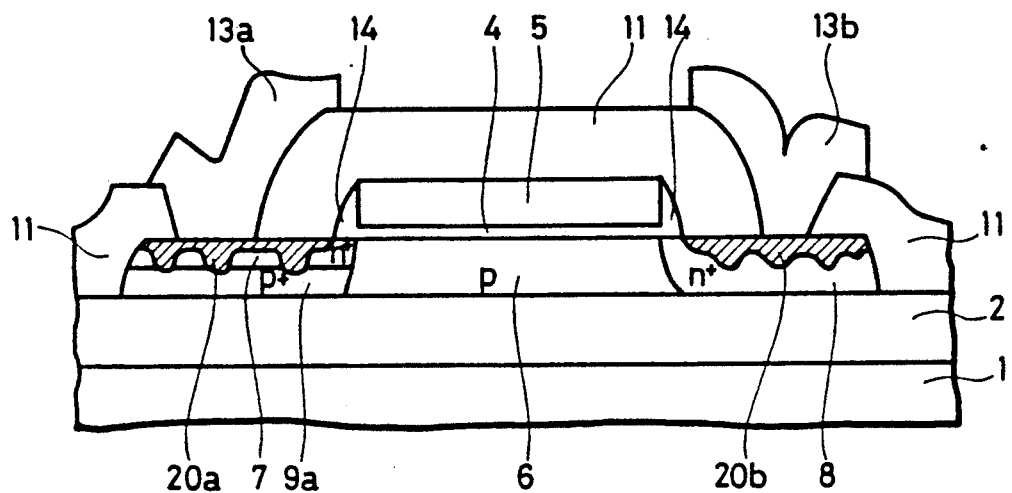

Referring to FIG. 5, a thin film SOI-MOSFET according to a still further embodiment of the present invention is shown in cross section. Although the thin film SOI-MOSFET of FIG. 5 is similar to that shown in FIG. 4, an insulator wall 14 is provided in FIG. 5, while titanium silicide layers 10a and 20b, each having a non-uniform thickness, are formed in a self-adjusting fashion from the upper surfaces of the source region 7 and the drain region 8. The thickness of the titanium silicide layer may be made non-uniform by heat treatment.

This non-uniform titanium silicide layer 20a extends locally to the depth of the carrier storage region 9a. Thus the excess positive holes stored in the carrier storage region 9a may be removed via the titanium silicide layer 20 and the conductor 13a. As a result, the excess positive holes produced by ionization upon collision may be removed more efficiently and promptly from the channel region 6 for further improving the source to drain withstand voltage characteristics. The titanium silicide layers 20a and 20b are also effective in improving the electrical conductivity of the source region 7 and the drain region 8, respectively.

It will be appreciated to those skilled in the art that, when the gate electrode 5 is formed of polysilicon, the titanium silicide layer may also be formed on the upper surface of the gate electrode 5 for improving the electrical conductivity of the gate electrode.

Figure 6:
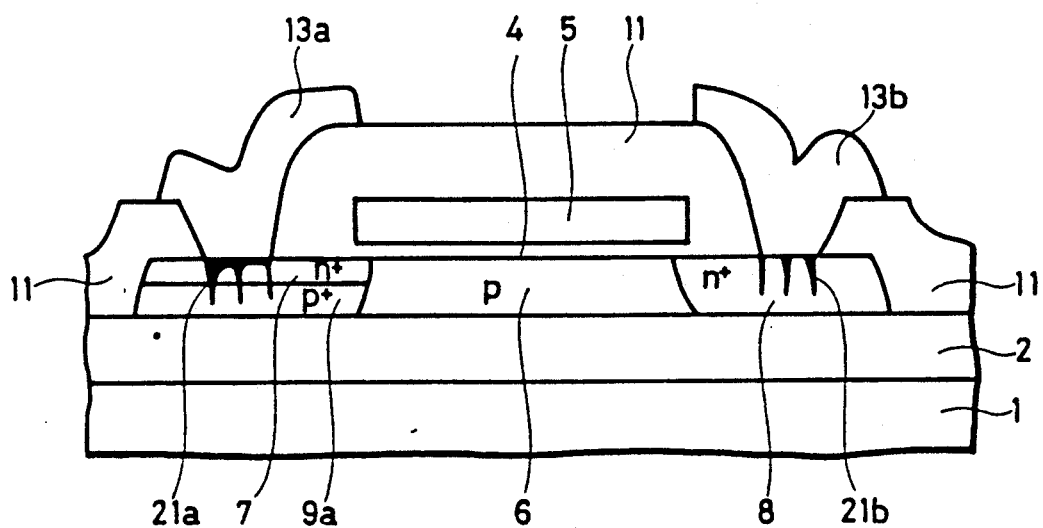

Referring to FIG. 6, a thin film SOI-MOSFET according to a still another embodiment of the present invention is shown in cross section. Although the thin film SOI-MOSFET of FIG. 6 is similar to that shown in FIG. 5, alloy spikes 21a and 21b are formed in FIG. 6 instead of the titanium silicide layers 20a and 20b, respectively. When the conductors 13a, 13b are formed of aluminum, the latter may be reacted with the silicon layer 3 to produce the alloy spikes 21a and 21b below these conductors. In this case, too, the carrier storage region 9a is electrically connected via alloy spike 21a to the conductor 13a, so that the excess positive holes stored in the carrier storage region 9a may be eliminated.

It will be noted that, in FIGS. 5 and 6, no carrier storage region is provided below the drain region 8, so that there is no risk of destruction of the drain junction by the titanium silicide layer 10b of non-uniform thickness or by the alloy spikes 21b.

For removing excess positive holes stored in the carrier storage region 9a, the contact hole 12a may be over-etched for directly connecting the conductor 13a to both the carrier storage region 9a and the source region 7.

Figure 7:
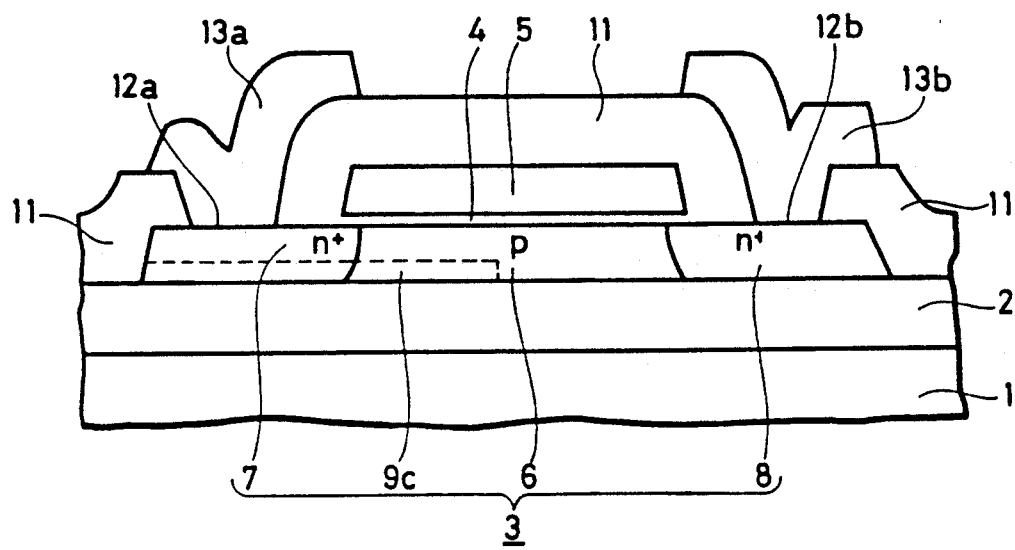
Figure 8:
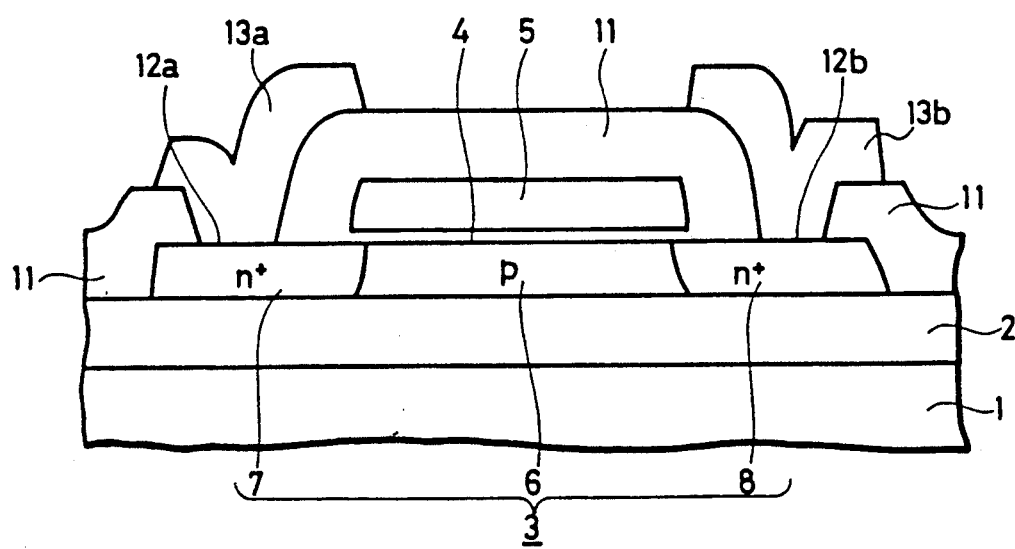
FIG. 8 is a sectional view showing a conventional SOI-MOSFET.
Figure 9:
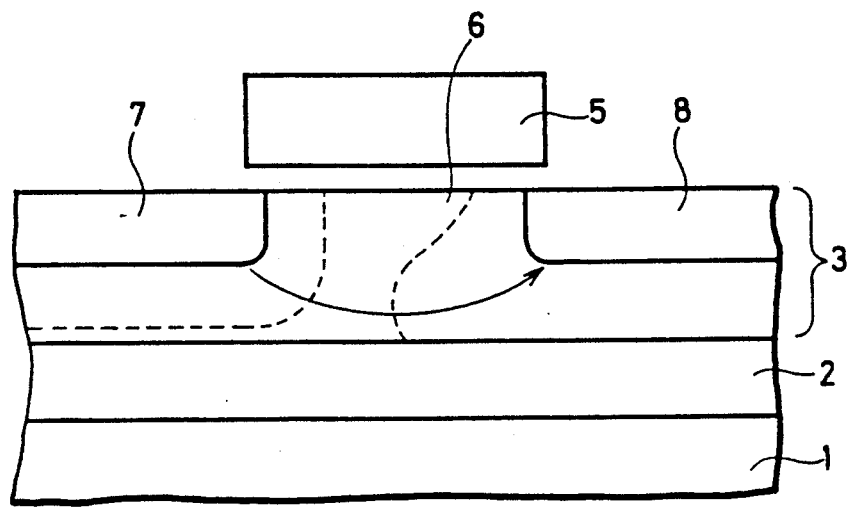
FIG. 9 is a sectional view illustrating the punch-through phenomenon in a conventional SOI-MOSFET.
Figure 10:
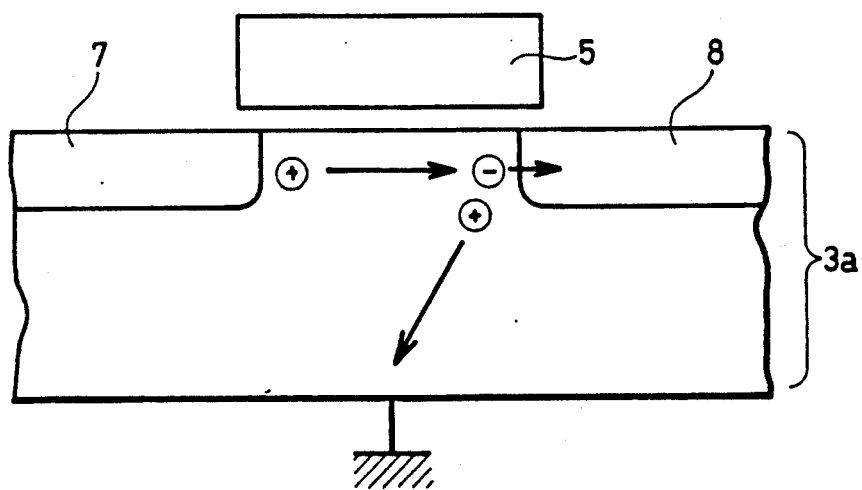
FIG. 10 is a sectional view of a conventional MOSFET on a bulky semiconductor substrate.
Figure 11:
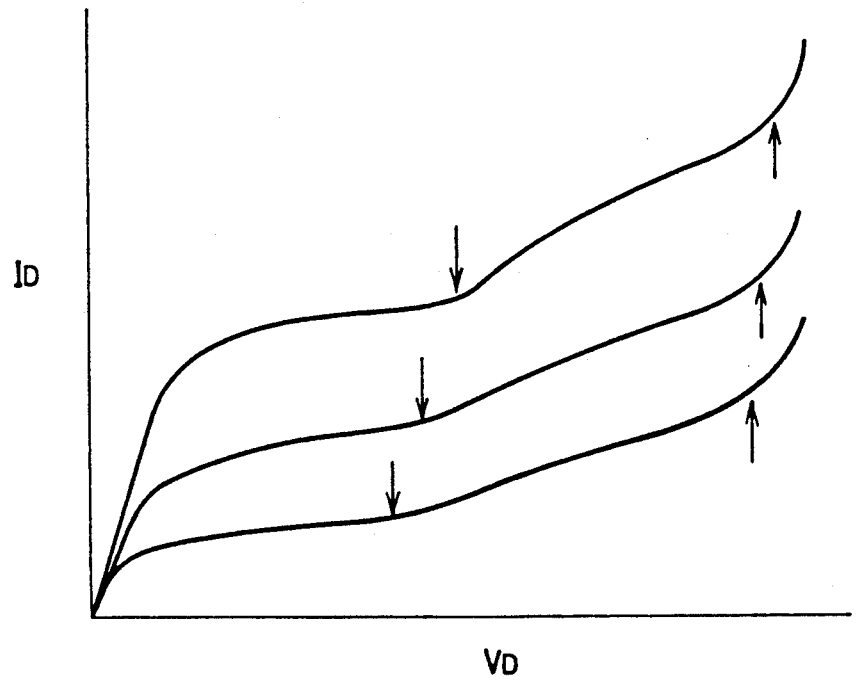
FIG. 11 is a diagram indicating the kink effect.

Referring to FIG. 7, a thin film SOI-MOSFET according to a still further embodiment of the present invention is shown in cross section. Although the thin film SOI-MOSFET of FIG. 7 is similar to that shown in FIG. 2, a crystal defect region 9c containing crystal defects introduced therein is provided in place of the carrier storage region 9a and in the vicinity of the source region 7 at the lower portions of the source region 7 and the channel region 6. Such defect region 9c may be formed by ion implantation of silicon or oxygen, focused ion beam (FIB) or by laser beam irradiation, using, for example, a resist pattern as the mask.

In the thin film SOI-MOSFET of FIG. 7, when excess positive holes are produced within the channel region 6 by ionization upon collision, these positive holes disappear by recombination with the electrons in the defect region 9c. Hence, no excess positive holes are stored in the channel region 6, resulting in improved drain resistance voltage characteristics.

However, the defect region 9c must not be formed to extend to the depletion layer formed in the vicinity of the boundary between the channel region 6 and the drain region 8. It is because otherwise a large amount of the leakage current will flow from the depletion layer through the crystal defects so that the transistor is made inoperative. However, formation of the defect region 9c across the boundary of the source region 7 and the channel region 6 does not present a disadvantage since the semiconductor junction is biased forward. Of course, the defect region 9c may be formed without extending into the source region 7. It is, however, preferred that the defect region 9c does not extend to the upper layer portion of the channel region 6 since, if the defect region extends to the channel region through which the carriers flow, the carrier mobility may be lowered to lower the current driving capabilities of the transistor.

It is noted that the defect region 9c formed at the lower layer portion of the silicon layer 3 gives rise to the effect of gettering, for example, atoms of impurity metals, so that the crystallinity of the upper layer portion of the silicon layer 3 is improved.

The defect region 9c is also useful for a SOI-MOSFET having a silicon layer with a thickness of 5000 Å and contributes to prevention of the aforementioned kinking effects.

Although the foregoing similar embodiments have been explained with respect to the n channel SOI-MOSFET, it will be apparent to those skilled in the art that the present invention may also be applied to a p-type SOI-MOSFET, and that the silicon layer 3 may also be replaced by other semiconductor layers.

It will be appreciated from the foregoing that the present invention provides a thin film SOI-MOSFET in which the carrier storage regions or the crystal direct region is provided for eliminating excess carriers of the same conductivity type as that of the channel region from the channel region thereby improving the source to drain resistant voltage characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A SOI-MOSFET comprising:
   source and drain regions formed of respective impurity regions of a first type in a thin semiconductor layer deposited not more than 1500 Å in thickness on an insulator;
   a channel region of a second impurity type formed in said thin semiconductor layer between said source region and said drain region, said channel region having a predetermined impurity concentration;
   a gate electrode positioned adjacent said channel region and separated from said semiconductor layer by an insulator layer deposited on said semiconductor layer;
   at least one floating carrier storage region having an impurity concentration of the second type higher than the predetermined impurity concentration of said channel region for removing and storing excess carriers of the second type from said channel region into said at least one floating carrier storage region, and
   an insulating film formed on upper surfaces of said source and drain regions and in lateral contact with, and completely covering, side edges of said source drain regions and of said at least one floating carrier storage region.

2. A SOI-MOSFET according to claim 1, wherein said at least one carrier storage region is formed in said semiconductor layer in contact with a portion of the bottom of said channel region and with a portion of the bottom of said source region.

3. A SOI-MOSFET according to claim 2, further comprising a second carrier storage region formed in said semiconductor layer in contact with a portion of the bottom of said channel region and with a portion of the bottom of said drain region.

4. A SOI-MOSFET comprising:
   source and drain regions formed of respective impurity regions of a first type in a thin semiconductor layer deposited not more than 1500 Å in thickness on an insulator;
   a channel region of a second impurity type formed in said thin semiconductor layer between said source region and said drain region, said channel region having a predetermined impurity concentration;
   a gate electrode positioned adjacent said channel region and separated from said semiconductor layer by an insulator layer deposited on said semiconductor layer;
   a carrier storage region having an impurity concentration of the second type higher than the predetermined impurity concentration of said channel region whereby excess carriers of the second type are removed from said channel region into said carrier storage region; said carrier storage region being formed in said semiconductor layer in contact with at least a portion of the bottom of said channel region and with at least a portion of the bottom of said source region; and
   a metal silicide layer formed on said source region and having a non-uniform depth, a portion of said metal silicide layer being of such depth that said portion of said metal silicide layer is passed locally through said source region to reach said carrier storage region.

5. A SOI-MOSFET comprising:
   source and drain regions formed of respective impurity regions of a first type in a thin semiconductor layer deposited not more than 1500 Å in thickness on an insulator;

a channel region of a second impurity formed in said thin semiconductor layer between said source region and said drain region, said channel region having a predetermined impurity concentration;

a gate electrode positioned adjacent said channel region and separated from said semiconductor layer by an insulator layer deposited on said semiconductor layer;

a carrier storage region having an impurity concentration of the second type higher than the predetermined impurity concentration of said channel region whereby excess carriers of the second type are removed from said channel region into said carrier storage, said carrier storage region being formed in said semiconductor layer in contact with at least a portion of the bottom of said channel region and with at least a portion of the bottom of said source region; and an aluminum layer formed on said source region, said aluminum layer including alloy spikes locally passing through said source region to reach said carrier storage region.

6. A SOI-MOSFET comprising:

source and drain regions formed of respective impurity regions of a first type in a thin semiconductor layer deposited not more than 1500 Å in thickness on an insulator, said drain region including a lightly doped drain;

a channel region of a second impurity type formed in said thin semiconductor layer between said source region and said drain region, said channel region having a predetermined impurity concentration;

a gate electrode positioned adjacent said channel region and separated from said semiconductor layer by an insulator layer deposited on said semiconductor layer; and at least one carrier storage region having an impurity concentration of the second type higher than the predetermined impurity concentration of said channel region whereby excess carriers of the second type are removed from said channel region into said carrier storage region.

7. A SOI-MOSFET according to claim 6, wherein said source region includes a lightly doped source.

8. A SOI-MOSFET according to claim 7, wherein said storage region is formed beneath said lightly doped source.

9. A SOI-MOSFET according to claim 8, further comprising a second carrier storage region formed beneath said lightly doped drain.

10. A SOI-MOSFET comprising:

source and drain regions formed of respective impurity regions of a first type in a thin semiconductor layer deposited not more than 1500 Å in thickness on an insulator, a channel region of a second impurity type formed in said thin semiconductor layer between said source region and said drain region;

a gate electrode positioned adjacent said channel region and separated from said semiconductor layer by an insulator layer deposited on said semiconductor layer; and a crystal defect region having crystal defects whereby excess carriers of the second type are removed from said channel region into said crystal defect region.

11. A SOI-MOSFET according to claim 10, wherein said crystal defect region is formed in at least said channel region at a lower layer portion in the vicinity of said source region.

12. A SOI-MOSFET according to claim 11, wherein said crystal defect region extends into a lower layer portion of said source region.

13. A SOI-MOSFET comprising in combination, an insulator;

a thin semiconductor layer deposited on said insulator;

a source region and a drain region formed of respective impurity regions of a first type in said thin semiconductor layer;

a channel region of a second impurity type formed in said thin semiconductor layer between said source region and said drain region;

a gate electrode positioned adjacent said channel region and separated from said thin semiconductor layer by an insulator layer deposited on said thin semiconductor layer;

at least one floating carrier removal means for removing and storing excess carriers of the second type from said channel region into said at least one carrier removal means, and an insulating film formed on upper surfaces of said source and drain regions, and in lateral contact with, and completely covering, side edges of source and drain regions and of said at least one floating carrier storage region; wherein said thin semiconductor layer is not more than 1500 Å thick such that application of a voltage to said gate electrode will cause the channel region as a whole to form a depletion layer.

14. A SOI-MOSFET according to claim 13, wherein:

said channel region has a predetermined concentration of the second type impurities, and said at least one carrier removal means comprises a carrier storage region having an impurity concentration of the second type higher than the predetermined impurity concentration of said channel region whereby the excess carriers of the second type are removed from said channel region into said carrier storage region.

15. A SOI-MOSFET according to claim 14, wherein said drain region comprises a lightly doped drain.

16. A SOI-MOSFET according to claim 15, wherein said source region comprises a lightly doped source.

17. A SOI-MOSFET according to claim 14, wherein:

the predetermined impurity concentration in said channel region is in the range of $10^{16}$ to $10^{17}$ atoms/cm$^3$; and the predetermined impurity concentration in said carrier storage region is in the range of $10^{17}$ to $10^{19}$ atoms/cm$^3$.

18. A SOI-MOSFET according to claim 13, wherein said at least one carrier removal means comprises a crystal defect region having crystal defects whereby the excess carriers of the second type are removed from said channel region into said crystal defect region.

19. A SOI-MOSFET according to claim 14, wherein said source region comprises:

a source having a first predetermined concentration of second type impurities; and a lightly doped source having a second predetermined concentration of second type impurities, wherein said second predetermined concentration is lower than said first predetermined concentration.

20. A SOI-MOSFET according to claim 14, wherein said drain region comprises:
   a drain having a first predetermined concentration of second type impurities; and
   a lightly doped drain having a second predetermined concentration of second type impurities, wherein said second predetermined concentration is lower than said first predetermined concentration.

21. A SOI-MOSFET according to claim 20, wherein said first predetermined concentration of second type impurities is in the range of $10^{19}$ to $10^{21}$ atoms/cm$^3$; and said second predetermined concentration of second type impurities is in the range of $10^{17}$ to $10^{18}$ atoms/cm$^3$.

22. A SOI-MOSFET according to claim 19, wherein said first predetermined concentration of second type impurities is in the range of $10^{19}$ to $10^{21}$ atoms/cm$^3$; and said second predetermined concentration of second type impurities is in the range of $10^{17}$ to $10^{18}$ atoms/cm$^3$.

* * * * *